(12) United States Patent
Langhammer et al.

(10) Patent No.: US 11,275,998 B2
(45) Date of Patent: Mar. 15, 2022

(54) CIRCUITRY FOR LOW-PRECISION DEEP LEARNING

(71) Applicant: Intel Corporation, Santa Clara, CA (US)

(72) Inventors: Martin Langhammer, Alderbury (GB); Sudarshan Srinivasan, Bangalore (IN); Gregg William Baeckler, San Jose, CA (US); Duncan Moss, Hillsboro, OR (US); Sasikanth Avancha, Bangalore (IN); Dipankar Das, Pune (IN)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 15/994,930

(22) Filed: May 31, 2018

(65) Prior Publication Data
US 2019/0042939 A1    Feb. 7, 2019

(51) Int. Cl.
| | |
|---|---|
| *G06N 3/08* | (2006.01) |
| *G06N 3/04* | (2006.01) |
| *G06N 3/063* | (2006.01) |
| *G06F 17/16* | (2006.01) |
| *G06F 7/501* | (2006.01) |
| *G06F 5/01* | (2006.01) |
| *G06F 7/509* | (2006.01) |
| *H03M 7/40* | (2006.01) |
| *H03M 7/42* | (2006.01) |
| *H03M 7/30* | (2006.01) |

(52) U.S. Cl.
CPC ............... *G06N 3/08* (2013.01); *G06F 5/01* (2013.01); *G06F 7/501* (2013.01); *G06F 7/509* (2013.01); *G06F 17/16* (2013.01); *G06N 3/04* (2013.01); *G06N 3/0454* (2013.01); *G06N 3/0481* (2013.01); *G06N 3/063* (2013.01); *H03M 7/4006* (2013.01); *H03M 7/42* (2013.01); *H03M 7/6011* (2013.01); *H03M 7/30* (2013.01)

(58) Field of Classification Search
CPC ...... G06N 3/08; G06N 3/0454; G06N 3/0481; G06N 3/04; G06N 3/063; G06F 5/509; H03M 7/4006; H03M 7/42; H03M 7/6011
USPC .................................................. 708/190, 768
See application file for complete search history.

(56) References Cited

U.S. PATENT DOCUMENTS 10,740,434 B1 *  8/2020  Duong ...................... G06T 1/20

OTHER PUBLICATIONS

Nvidia. "Interface Platforms for the Data Center." last accessed Jul. 10, 2018. https://www.nvidia.com/en-us/deep-learning-ai/inference-platform/hpc/.

(Continued)

*Primary Examiner* — Tan V Mai
(74) *Attorney, Agent, or Firm* — Fletcher Yoder, P.C.

(57) ABSTRACT

The present disclosure relates generally to techniques for improving the implementation of certain operations on an integrated circuit. In particular, deep learning techniques, which may use a deep neural network (DNN) topology, may be implemented more efficiently using low-precision weights and activation values by efficiently performing down conversion of data to a lower precision and by preventing data overflow during suitable computations. Further, by more efficiently mapping multipliers to programmable logic on the integrated circuit device, the resources used by the DNN topology to perform, for example, inference tasks may be reduced, resulting in improved integrated circuit operating speeds.

20 Claims, 8 Drawing Sheets

(56) References Cited

OTHER PUBLICATIONS

Zhang, Chen et al. "Optimizing FPGA-based Accelerator Design for Deep Convolutional Neural Networks." FPGA (2015).
Zhu, Chenzhuo et al. "Trained Ternary Quantization." CoRR abs/1612.01064 (2016): n. pag.
Moss, Duncan J. M. et al. "High performance binary neural networks on the Xeon+FPGA™ platform." 2017 27th International Conference on Field Programmable Logic and Applications (FPL) (2017): 1-4.
Nurvitadhi, Eriko et al. "Accelerating Binarized Neural Networks: Comparison of FPGA, CPU, GPU, and ASIC." 2016 International Conference on Field-Programmable Technology (FPT) (2016): 77-84.
Nurvitadhi, Eriko et al. "Can FPGAs Beat GPUs in Accelerating Next-Generation Deep Neural Networks?" FPGA (2017).
Hubara, Itay et al. "Quantized Neural Networks: Training Neural Networks with Low Precision Weights and Activations." Journal of Machine Learning Research 18 (2017): 187:1-187:30.
He, Kaiming et al. "Deep Residual Learning for Image Recognition." 2016 IEEE Conference on Computer Vision and Pattern Recognition (CVPR) (2015): 770-778.
Motamedi, Mohammad et al. "Design space exploration of FPGA-based Deep Convolutional Neural Networks." 2016 21st Asia and South Pacific Design Automation Conference (ASP-DAC) (2016): 575-580.
Courbariaux, Matthieu et al. "Binarized Neural Networks: Training Neural Networks with Weights and Activations Constrained to +1 or -1." CoRR 2016.
Rastegari, Mohammad et al. "XNOR-Net: ImageNet Classification Using Binary Convolutional Neural Networks." ECCV (2016).
Mellempudi, Naveen et al. "Ternary Neural Networks with Fine-Grained Quantization." CoRR abs/1705.01462 (2017): n. pag.
Suda, Naveen et al. "Throughput-Optimized OpenCL-based FPGA Accelerator for Large-Scale Convolutional Neural Networks." FPGA (2016).
Jouppi, Norman P. et al. "In-datacenter performance analysis of a tensor processing unit." 2017 ACM/IEEE 44th Annual International Symposium on Computer Architecture (ISCA) (2017): 1-12.
Gysel, Philipp et al. "Hardware-oriented Approximation of Convolutional Neural Networks." CoRR abs/1604.03168 (2016): n. pag.
Gupta, Suyog et al. "Deep Learning with Limited Numerical Precision." ICML (2015).
Gokhale, Vinayak et al. "Snowflake: A Model Agnostic Accelerator for Deep Convolutional Neural Networks." CoRR abs/1708.02579 (2017): n. pag.
Ma, Yufei et al. "End-to-end scalable FPGA accelerator for deep residual networks." 2017 IEEE International Symposium on Circuits and Systems (ISCAS) (2017): 1-4.
Lin, Zhouhan et al. "Neural Networks with Few Multiplications." CoRR abs/1510.03009 (2015): n. pag.
Arria 10, "Most Comprehensive Ecosystem." Altera Corporation, https://www.altera.com/products/fpga/arria-series/arria-10/overview.html, last accessed Jul. 24, 2018.

\* cited by examiner

CIRCUITRY FOR LOW-PRECISION DEEP LEARNING

BACKGROUND

This disclosure relates to reducing area and/or improving the performance of circuitry implemented on an integrated circuit (e.g., an FPGA) and used in machine learning. More specifically, this disclosure relates to efficiently handling activations and weights used in machine learning applications and/or to more efficient mapping of multipliers to programmable logic of the integrated circuit.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Machine learning is becoming increasingly valuable in a number of technical fields. For example, machine learning may be used in natural language processing, image processing, computer vision, such as object recognition, bioinformatics, and economics, among other fields and applications. Deep learning, which is a subset of machine learning, may use a number of inference computations in a neural network to deliver prediction data for use in suitable fields and applications, such as those listed above. Because these inference computations may include a number of dot-products, which may include a set of multiplications followed by addition, multiplier circuits may be used in deep learning applications. Further, the growth of neural networks in deep learning may result in increased amounts of data and inference computations. Accordingly, to accommodate growth and improvement of machine learning implementations and applications, such as deep learning, the number of multipliers implemented in and/or the amount of data handled by an integrated circuit may increase dramatically. However, multipliers and data handling circuits may consume significant area, power, and routing resources of the integrated circuit.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
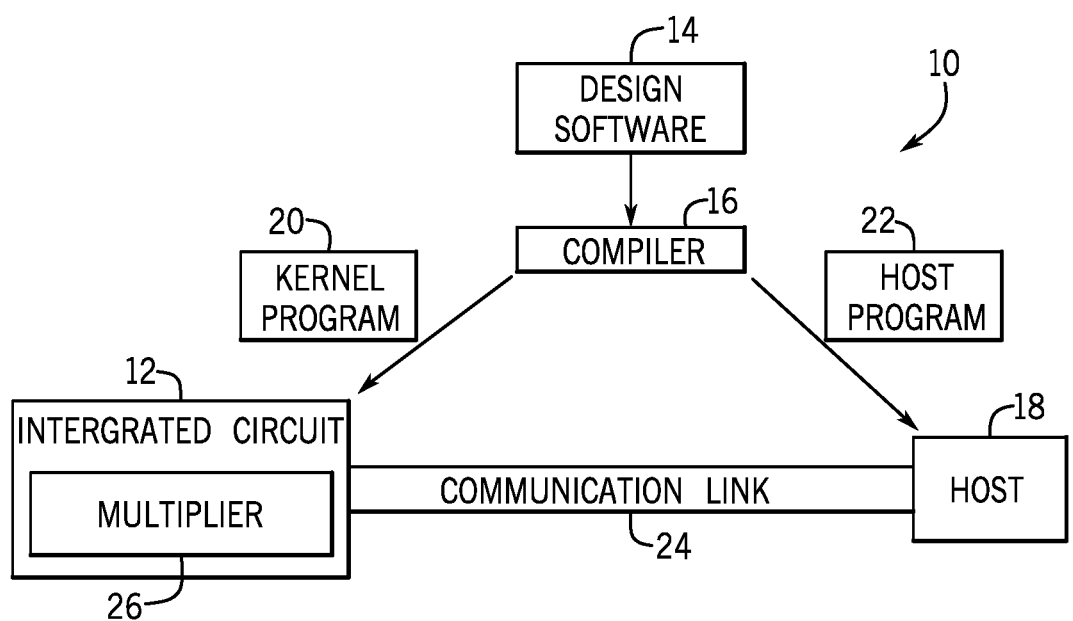
FIG. 1 is a block diagram of a system for implementing deep learning, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to reducing the area used to perform low-precision operations on an integrated circuit device and/or to increase the maximum operating speed of the integrated circuit device. More specifically, the present disclosure relates to efficiently handling low-precision activations and weights in a deep neural network (DNN) and/or to more efficient mapping of multipliers to programmable logic to reduce the resources used by the DNN and improve its operating speed and efficiency. Because the systems and methods of this disclosure may be particularly effective when applied to low-precision operations (e.g., those with a precision of 8 bits or fewer, or even 1 or 2 bits), the examples discussed below will relate to low-precision operations. However, these systems and methods may be used to improve circuits to perform operations of any suitable precision.

To efficiently handle activations and weights in the DNN, low-precision activations and weights, computation results may be monitored to prevent data overflow. To further handle the low-precision data and operations, between a first computation with an output having a first precision and a second computation receiving the output as an input to an input having a second precision, down conversion within a set range of values may pseudo-randomly be performed on the output. Further, to reduce the logic and routing involved with implementing and/or mapping the multipliers to programmable logic to perform, for example, inference tasks in the DNN, programmable negation may be implemented in programmable logic as programmable inversion. As will be discussed in further detail below, by implementing programmable negation with programmable inversion and including a correction factor in the programmable logic, a multiplier may be implemented with fewer resources (e.g., area, hardware, wiring, and/or the like). Accordingly, computations handled by the multiplier, such as dot-products, may run faster and more efficiently, reducing the time and/or resources involved with higher level computations, such as convolutions and/or inference tasks.

With the foregoing in mind, FIG. 1 illustrates a block diagram of a system 10 that may implement machine learning techniques. A designer may desire to implement functionality, such as a deep neural network (DNN) configured to perform inference computations, on an integrated circuit device 12 (IC, such as a field programmable gate array (FPGA)). The designer may specify a high-level program to be implemented, such as an OpenCL program, which may enable the designer to more efficiently and easily provide programming instructions to configure a set of programmable logic cells for the integrated circuit device 12 without requiring specific knowledge of low level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the IC.

The designers may implement their high-level designs using design software 14, such as a version of Intel® Quartus® by INTEL CORPORATION. The design software 14 may use a compiler 16 to convert the high-level program into a low-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of a multiplier 26 on the integrated circuit device 12. The multiplier 26 may include circuitry and/or other logic elements and may be configured to implement, for example, machine learning operations.

Figure 2:
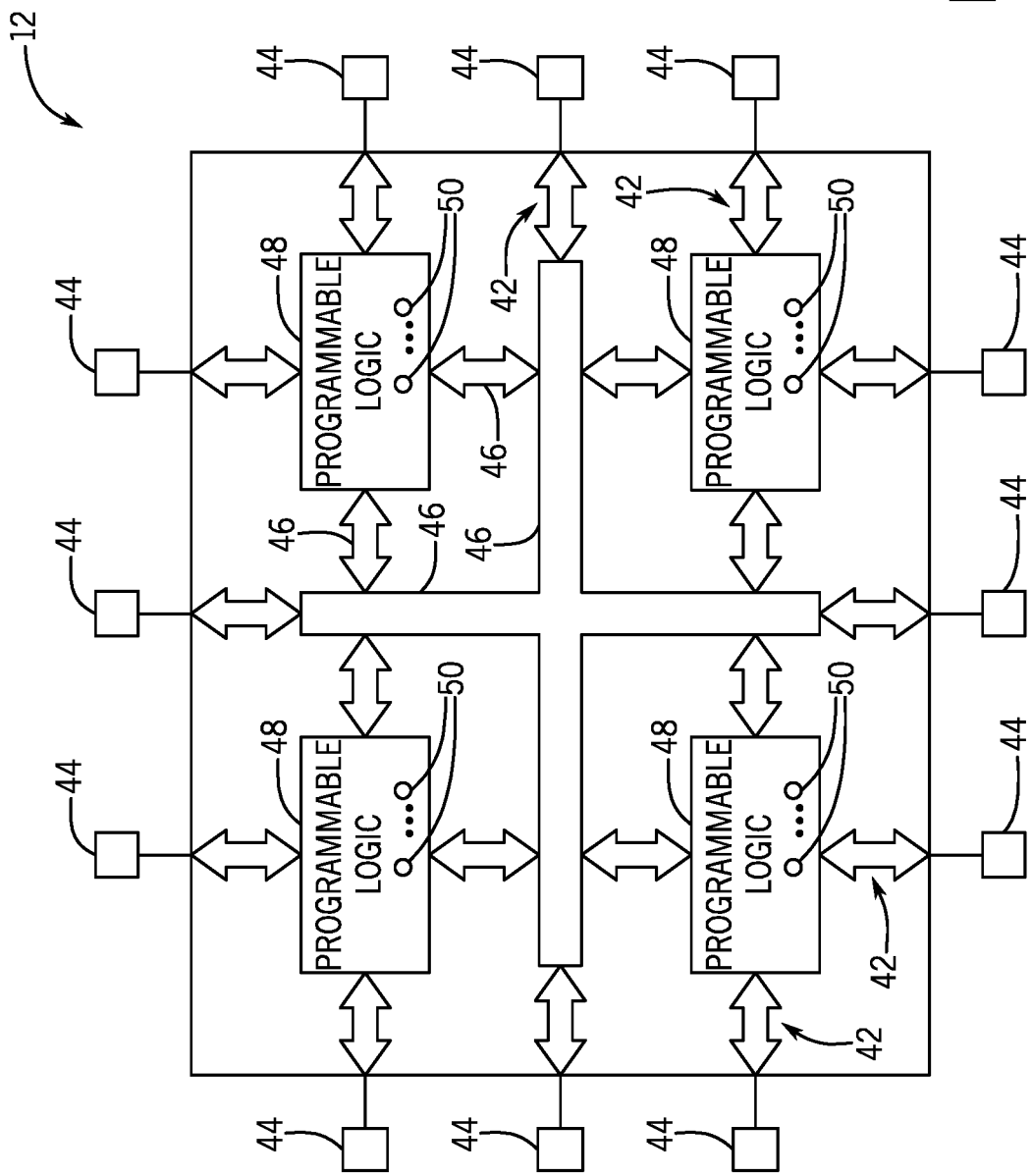
FIG. 2 is a block diagram of an integrated circuit where deep learning may be implemented, in accordance with an embodiment.

Turning now to a more detailed discussion of the integrated circuit device 12, FIG. 2 illustrates an integrated circuit device 12, which may be a programmable logic device, such as a field programmable gate array (FPGA). Further, it should be understood that the integrated circuit device 12 may be any other suitable type of programmable logic device (e.g., an application-specific integrated circuit and/or application-specific standard product). As shown, integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as integrated circuit device 12, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
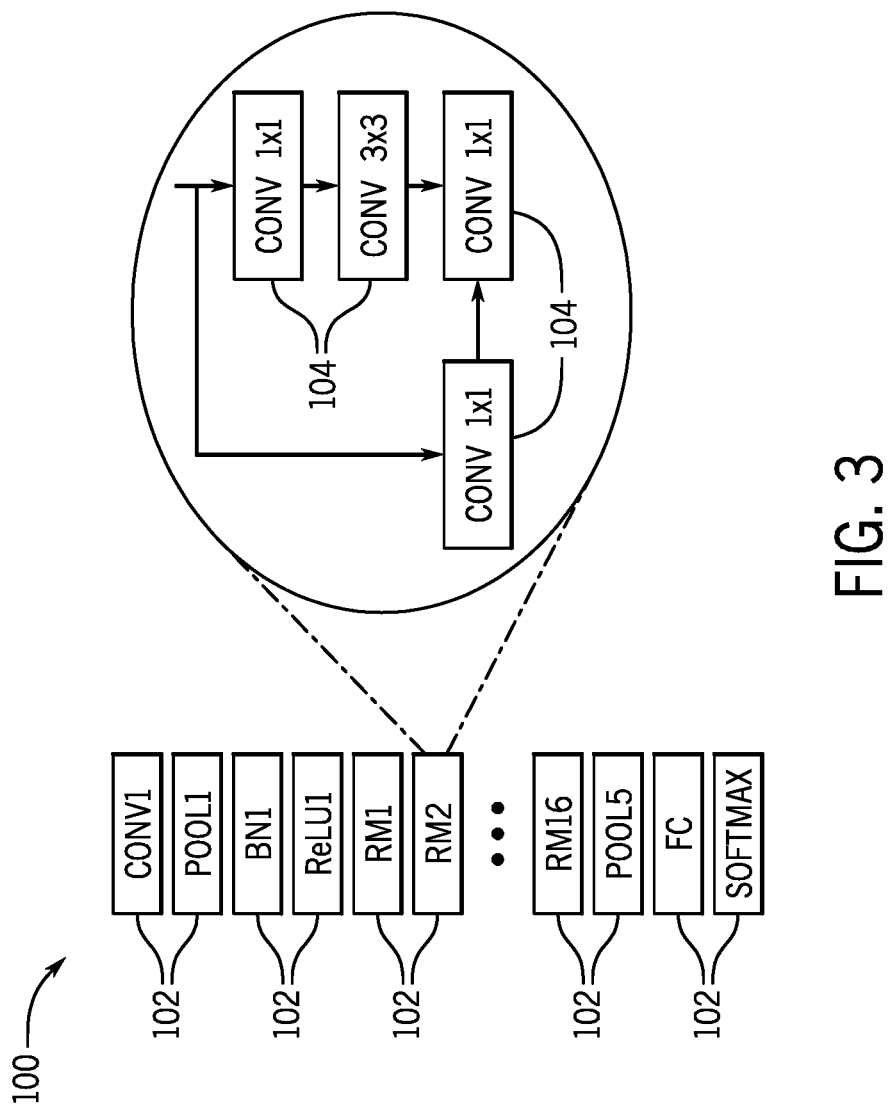
FIG. 3 is a deep neural network topology for implementing deep learning, in accordance with an embodiment.

To implement deep learning and/or inference tasks involved with deep learning, an integrated circuit device 12, such as an FPGA, may map a deep neural network (DNN) to programmable logic 48. In some embodiments, as illustrated in FIG. 3, the deep neural network topology 100 may be implemented with a deep residual network (e.g., ResNet) topology. The DNN topology 100 may include a number of modules 102 (e.g., layers) that may each perform a set of operations in order to perform inference. Of these operations, the integrated circuit device 12 may use significant resources (e.g., area, time, hardware, and/or the like) to compute convolution operations 104, which may be involved with generating convolutional neural network (CNN) inferences. In some cases, such as with image classification, for example, convolution operations 104 may be used in the DNN topology 100 to convolve a filter with an input matrix, or map. Both the filter and the input matrix may have a complex structure (e.g., three-dimensional matrix, four-dimension matrix, and/or the like) with any suitable size (e.g., number of entries), and the structure of the filter may not match the structure of the input matrix. As the structure of the filter and/or the input matrix becomes more complex and/or the size of the filter and/or the input matrix increases, the convolution operation 104 may be computed with an increased number of arithmetic operations (e.g., dot-products), which may use an increased amount of resources on the integrated circuit device 12.

Part of the complexity involved with the convolution operations 104 is related to the precision (e.g., bit-width) of the input and output data. Maintaining the full precision (e.g., 32-bits) of data input to and/or output from the convolution operations 104 may preserve accuracy of the data, but doing so may use significant area and/or resources on the integrated circuit device 12. Accordingly, because lower precision data representations may be sufficient to maintain a suitable accuracy for inference tasks and because the size of full precision data involved with the convolution operations 104 may be cumbersome to maintain, a lower precision format may be used to represent data in a portion of the DNN topology 100. Thus, while some embodiments may use 32-bit floating point representation of data, in some embodiments, input (e.g., activation) values may be represented as 8-bit data. In such cases, 2-bit weights, which may be constrained to the values +1, −1, and 0 (e.g., ternary weights), may also be implemented so that the DNN topology 100 may support 8-bit activations with 2-bit weights (e.g., 8a-2w).

Figure 4:
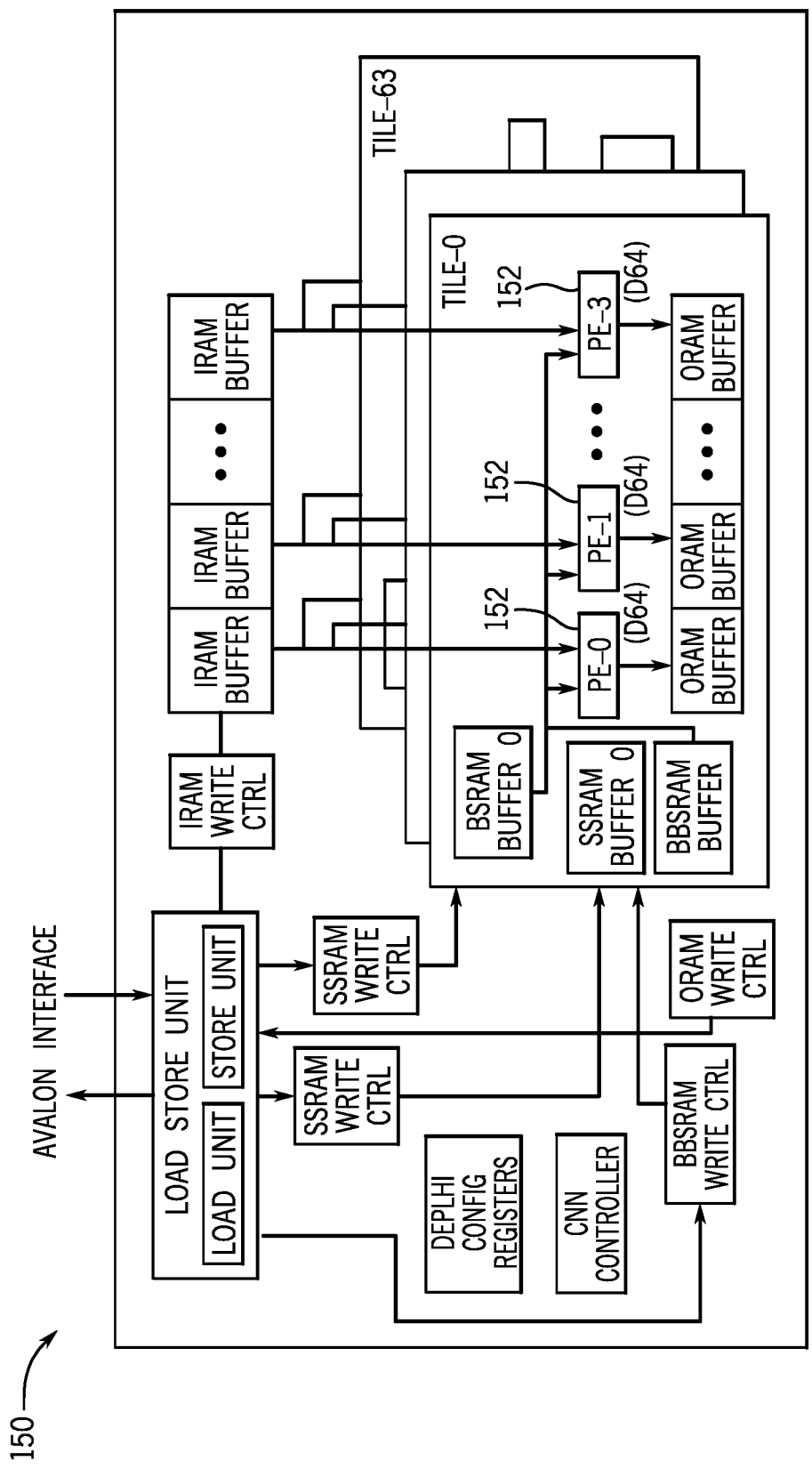
FIG. 4 is a block diagram of circuitry for implementing the deep neural network topology of FIG. 3, in accordance with an embodiment.

Turning to now to FIG. 4, the DNN topology 100 may contain an accelerator 150 (e.g., an FPGA accelerator) with a number of processing engines 152 that may each perform a dot-product computation (e.g., a 64 element dot-product (dot64 or D64)) using a number of weights (e.g., 2-bit weights) and an input feature map (IFM), which may contain a number of 8-bit activations. The dot-product computation may accumulate the 8-bit activations and 2-bit weights over the IFM to produce a 15-bit output, which may be included in an output feature map (OFM). The 15-bit output (e.g., OFM value) may then be scaled to produce a 23-bit output value, and an accumulator may then accumulate (e.g., sum) a number of these 23-bit outputs. As the number of 23-bit outputs accumulated increases, the likelihood that a result of the accumulations overflows (e.g., beyond a target precision) increases. Overflow of the result may cause information related to a most significant bit (MSB) of the result to be lost, which may impact the accuracy of the result.

Accordingly, to prevent overflow of the accumulation of the scaled outputs (e.g., 23-bit outputs), the scaled outputs and/or the OFM values (e.g., 15-bit outputs) may be shifted prior to and/or upon accumulation. To do so, the integrated circuit device 12 may include logic and/or circuitry (not shown) that may receive the value of a number, such as an OFM value, a scaled output, and/or a result of an accumulation, and a bit-width, which may be configured, as inputs. The bit-width may dictate a maximum size (e.g., number of bits) that a number may reach to prevent overflow. The integrated circuit device 12 may then determine the bit position of the MSB of the number, and if the bit position of the MSB is determined to be greater than the bit-width, the number may be right-shifted by a number of bits. The number of bits the number is right-shifted by may be determined by the bit-width subtracted from the bit position of the MSB. For example, if the bit position of the MSB of a number is 21 and the configured bit-width is 19 bits, the number may be right-shifted by two bits (e.g., 21-19). By right-shifting the number, the MSB of the number may be preserved instead of overflowed.

Further, while right-shifting a number may result in a loss of data contributed by one or more least significant bits (LSB) (e.g., the bits shifted out of the number), the eventual accuracy of computations in the DNN topology 100 may be maintained. Because only numbers that are out of range (e.g., that will overflow) may be shifted and because the size (e.g., number of bits) of the shifts may remain small, the loss of data may remain limited. Since the DNN topology 100 is probabilistic, the DNN topology 100 may be designed for resilience against such minor data changes.

Each module 102 that uses a processing engine 152 may use 8-bit values (e.g., 8-bit activation values) as inputs. Because, as described above, the output of the processing engine 152, and subsequently, of the module 102, may be scaled to a higher precision (e.g., a 23-bit value) and because this output may then feed into another module 102 using a processing engine 152, the integrated circuit device 12 may include a down-conversion engine (not shown) in the DNN topology 100. The down-conversion engine may be implemented with any suitable resources on the integrated circuit device 12 and may down-convert values from a higher precision (e.g., 23-bits) to a lower precision (e.g., 8-bits) so that the precision of the value may suitably be handled by a module 102 and/or a processing engine 152.

To perform suitable down-conversion, the down-conversion engine may find the absolute maximum of all of the OFM values (e.g., output values) in a module 102. With the absolute maximum of all of the OFM values, the down-conversion engine may determine a shift-value (e.g., a number of bits) to right-shift each OFM by to ensure each OFM is reduced to a lower precision. In the case of an absolute maximum OFM value having 23 bits, for example, to down-convert each OFM value to an 8-bit precision, the down-conversion engine may use a shift value of 15 (e.g., 23-8).

While the method above may ensure each OFM value is down-converted to a suitable precision for use in a subsequent module 102, finding the absolute maximum of all OFM values in a module 102 may use significant time and/or resources. Because the steps involved with down-conversion of the OFM values may occur in a critical path of the DNN topology 100, reducing the time and/or resources involved with implementing down-conversion may result in significant improvements of performance and/or speed of the DNN topology 100.

Accordingly, in some embodiments, to determine the shift-value, a minimum-sized module 102 (Smin) and a maximum-sized module 102 (Smax), each in terms of a total number of OFMs, may be determined across the entire DNN topology 100. With a ResNet-50 topology, for example, a minimum-sized module 102 may contain 64 OFMs, and a maximum-sized module 102 may contain 2048 OFMs. A bit-count term (BC) may then be determined based on the number of bits resulting from the division of Smax by Smin values (e.g., BC=bit-count (Smax/Smin)). The bit-count term may then be stored in a configurable register in the integrated circuit device 12. Further, because each of the processes described above with respect to determining Smin, Smax, and BC are dependent on the DNN topology 100, which may be known before runtime, they may be implemented before runtime of the integrated circuit device 12.

With a calculated value for BC, which may be stored in a configurable register, during runtime, the down-conversion engine may generate a pseudo-random number (R) between 0 and $2^{BC}-1$. Using R, the down-conversion engine may then determine the absolute maximum of only an Smin number of OFM values starting at the OFM corresponding to Smin×R. Accordingly, the search for the absolute maximum OFM value may be bounded and may be independent of the number of OFMs, which may result in a more efficient down-conversion process. The shift-value may then be determined based on the absolute maximum OFM value determined according to the techniques described above and may be applied to OFM values in each suitable module 102. Further, because the number R is generated pseudo-randomly with a reasonably uniform distribution, down-conversion with this technique may result in similar accuracy when compared to down-conversion of OFM values based on an absolute maximum of all OFM values in a layer.

As described herein, the DNN topology 100 may include a number of convolution operations 104, which may be implemented with a suitable number of dot-product operations. Each dot-product operation may include a set of multiplications followed by an addition. Further, as described, DNN topologies 100 may be implemented with low-precision activations (e.g., 8-bits or fewer) and low-precision weights (e.g., 1-bit and/or 2-bit weights). Integrated circuit devices 12, and more specifically, FPGAs may be well suited to perform low-precision operations, such as dot-products, on such activations and/or weights; however, in general, logic circuitry (e.g., programmable logic 48) in FPGAs and/or integrated circuit devices 12 have not been optimized for low-precision computations specific to deep learning. Accordingly, techniques for synthesis and mapping of FPGAs and/or integrated circuit devices 12 resulting in reduced area used to perform low-precision operations and increased operating speed may be implemented, and more specifically, techniques for efficiently implementing programmable negation may be implemented.

Figure 5:
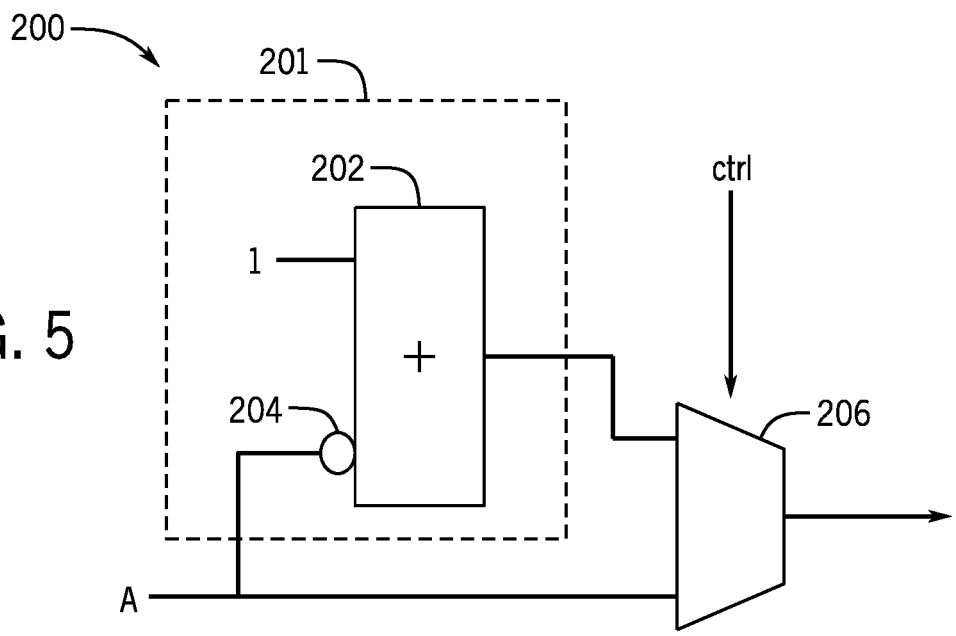
FIG. 5 is a block diagram of programmable negation circuitry, in accordance with an embodiment.

Negating a number (A) (e.g., a number represented in two's complement) in digital logic can be accomplished using the relationship (−A)=∼A+1, where ∼ corresponds to bitwise inversion (e.g., complement). Further, programmable negation may facilitate selection between the number (A) and its negate (−A) based on a control signal. Accordingly, as illustrated in FIG. 5, programmable negation circuitry 200 may include negation circuitry 201 and selection circuitry 206 (e.g., a multiplexer (MUX)). The negation circuitry 201 may receive a number (A), which may include one or more bits, and may invert each of the bits included in the number (A) with inversion circuitry 204 (e.g., a NOT gate). The negation circuitry 201 may also include an adder 202 (e.g., adder circuitry) that may add a +1 term to the output of the inversion circuitry 204 so that the output of the adder 202 may be represented as ∼A+1 (e.g., (−A)). This output of the adder 202 may feed into the selection circuitry 206 along with the number (A). As such, the selection circuitry 206 may be programmed to output either the number (A) or its negate based on a control (e.g., select) signal (ctrl). In some embodiments, for example, the control signal (ctrl) may represent a single-bit signal, and in such cases, a control signal (ctrl) value of '0' may cause the selection circuitry 206 to output the number (A), while a control signal (ctrl) value of '1' may cause the selection circuitry 206 to output the negate of the number (e.g., (−A)), or vice versa.

Figure 6:
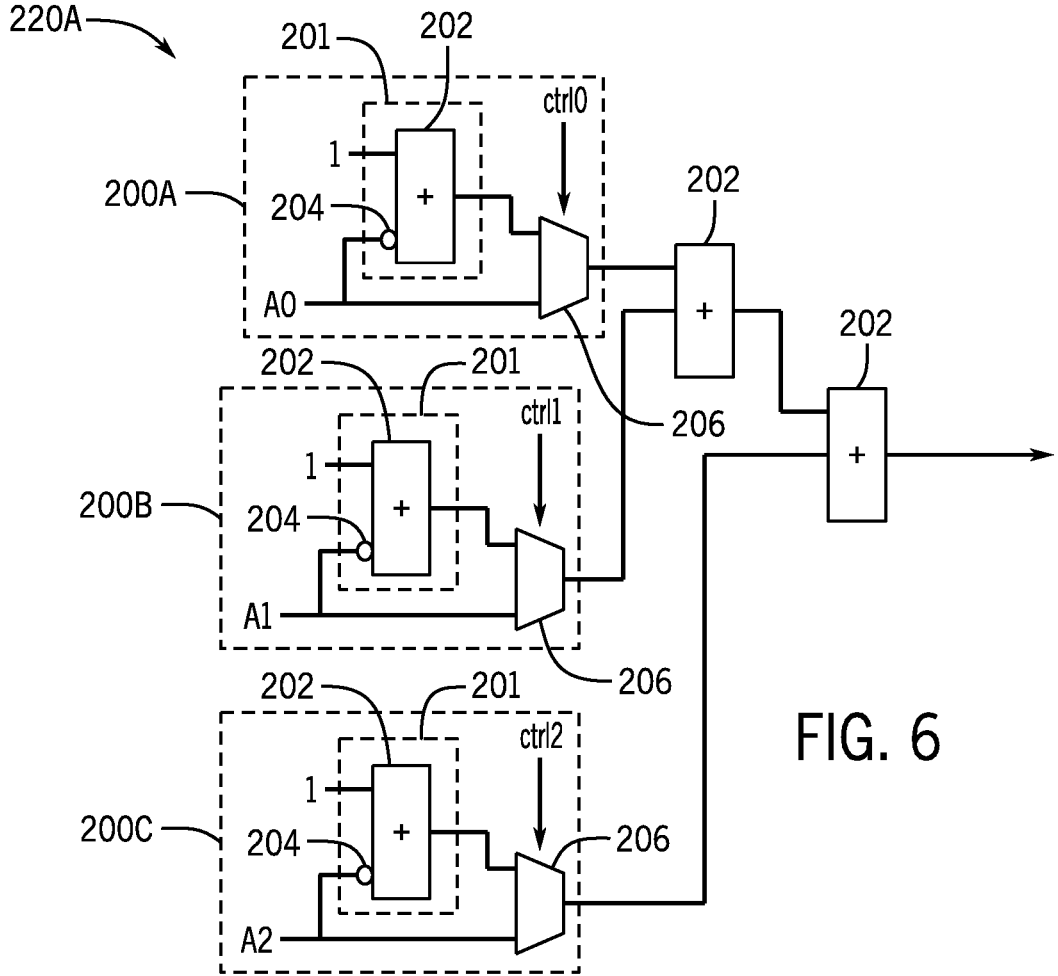
FIG. 6 is a block diagram of an adder tree, which may implement a binary dot-product, including programmable negation circuitry, in accordance with an embodiment.

Further, as illustrated in FIG. 6, a binary dot-product, which may be implemented in the DNN topology 100 and may be implemented by a multiplier, may involve the summation of outputs from several programmable negation circuitries 200. Accordingly, in some embodiments, the output of negation circuitries 200 may be summed by an adder tree 220A. In the illustrated embodiment, for example, an adder tree 220A may receive the programmable output from each of a first programmable negation circuitry 200A, a second programmable negation circuitry 200B, a third programmable negation circuitry 200C and may sum these programmable outputs with a set of one or more adders 202 not included in the programmable negation circuitry 200 (e.g., 200A, 200B, or 200C).

However, as can be seen in the illustrated embodiment, summing outputs of programmable negation circuitry 200 may be resource (e.g., area, routing, hardware, and/or the like) intensive. To that end, while the illustrated adder tree 220A includes two adders 202 to sum the outputs of the programmable negation circuitry 200, the programmable negation circuitry 200 may contribute an additional three adders 202 into the adder tree 220A to handle the +1 operations, more than doubling its size. As an additional example, in a balanced adder tree 220A with M elements, such as a binary reduction tree with a power of two number of input elements, the balanced adder tree 220A may include M−1 adders 202 to sum the M elements, and M additional adders 202 may be used to perform the +1 operation involved in the negation circuitry 200. Accordingly, the programmable negation circuitry 200 may add one or more levels of logic (e.g., M additional adders 200) to the adder tree 220A. Further, while a balanced adder tree 220A is described above, an unbalanced adder tree 220A may experience comparable resource growth.

Figure 7:
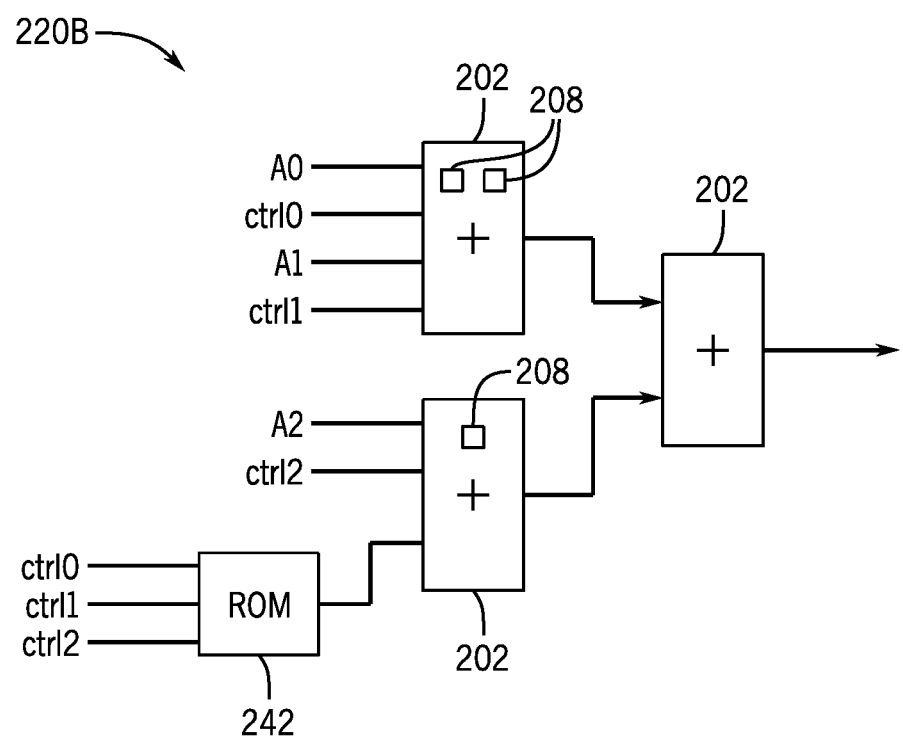
FIG. 7 is a block diagram of a restructured adder tree including programmable inversion circuitry and a correction factor, in accordance with an embodiment.

Accordingly, to reduce the physical resources (e.g., adders 202, wiring, and/or the like) associated with operations, such as a dot-product, that may be implemented in a DNN topology 100, an adder tree 220A that includes programmable negation outputs may be replaced with and/or implemented as an adder tree 220B with a different structure, as illustrated in FIG. 7. The adder tree 220B may include three adders 202 and an arithmetic compressor 242 (e.g., memory). In some embodiments, adders 202 may be implemented as ripple-carry adders, and as such, the adders 202 may respectively include suitable combinatorial circuitry 208, such as a look up table (LUT), associated with them. This combinatorial circuitry 208 may perform certain logic functions.

Accordingly, a first adder 202 may receive, from input circuitry (e.g., wiring), a first number (A0) and a first control signal (ctrl0) as inputs. The combinatorial circuitry 208 (e.g., LUT) associated with the first adder 202 may then output the first number (A0) or its inverse (∼A0) based on the value of the programmable first control signal (ctrl0). To do so, the combinatorial circuitry 208 may determine the result of a bitwise exclusive OR (XOR) of the first number and the first control signal (e.g., A0^ctrl0). As such, when the value of the first control signal (ctrl0) is '1', the output of the combinatorial circuitry 208 may be the inverse of the first number (∼A), and the output of the combinatorial circuitry 208 may be the first number (A) when the value of the first control signal (ctrl0) is '0'. The first adder 202 may also receive a second number (A1) and a second control signal (ctrl1) as inputs. Additional combinatorial circuitry 208 associated with the first adder 202 may then determine the bitwise exclusive OR of the second number (A1) and the second control signal (ctrl1) to output the second number (A1) or its inverse (∼A1) based on the second control signal (ctrl1). The first adder 202 may then sum the outputs of the combinatorial circuitry 208 and the additional combinatorial circuitry 208, which may correspond to summing a suitable combination of the first number (A0) or its inverse (∼A0) with the second number (A1) or its inverse (∼A1). The first adder 202 may output this sum to a second adder 202 for further summation.

A third adder 202 may receive a third number (A2) and a corresponding third control signal (ctrl2). Accordingly, combinatorial circuitry 208 associated with the third adder 202 may programmatically output the third number (A2) or its inverse (∼A2) based on the value of the third control signal (ctrl2). As such, the combinatorial circuitry 208 may determine the bitwise exclusive OR of the third number (A2) and the third control signal (ctrl2). Thus, the adder tree 220B may facilitate programmable inversion of the first number (A0), the second number (A1), and the third number (A2) via the first adder 202 and the third adder 202, respectively.

Accordingly, in order to generate the same output (e.g., identically valued) generated by the adder tree 220A of FIG. 6, the adder tree 220B may address error introduced by summing values generated by programmable inversion (e.g., by the first adder 202 and the third adder 202) instead of summing values generated by programmable negation. Due to the missing +1 operations, each inversion replacing a negation may increase the error by one. In the illustrated embodiment, for example, the error of the second adder tree 220B compared to the adder tree 220A of FIG. 6 may be three. As such, the arithmetic compressor 242 (e.g., read-only memory (ROM)) may output a correction factor (e.g., value) to be added into the adder tree 220B to address errors introduced by the programmable inversion.

To determine the correction factor, the arithmetic compressor 242 may receive each of the control signals (e.g., ctrl0, ctrl1, and ctrl2) and may add them together. Because the control signals (e.g., ctrl0, ctrl1, and ctrl2) may indicate to the combinatorial circuitry 208 associated with a respective adder 202 to invert a number (e.g., A0, A1, or A2) when the value of the control signal is '1' and because the error of replacing an inversion with a negation is '1', adding the values of the control signals (e.g., ctrl0, ctrl1, and ctrl2) may generate a correction factor suitable to address the error. Accordingly, adding this correction factor to the adder tree 220B may eliminate and/or substantially reduce the error resulting from using the adder tree 220B of FIG. 7 instead of the adder tree 220A of FIG. 6.

Further, by consolidating the '+1' operations used in the programmable negations of the adder tree 220A of FIG. 6 to a single location (e.g., arithmetic compressor 242), the adder tree 220B may be constructed with increased flexibility. Accordingly, the adder tree 220B and its placement of the arithmetic compressor 242 may be structured to pack efficiently and/or to better meet packing needs of a device, such as the integrated circuit device 12. More specifically, in some embodiments, by deferring and/or rearranging the addition involved with generating the correction factor (e.g., the +1 operations), an arithmetic compressor 242 structure, which may be implemented in memory, may reduce the area used to account for the error introduced by using programmable inversion in place of programmable negation. To do so, the arithmetic compressor 242 may implement, for example, redundant form arithmetic (e.g., 3:2 compression, 2:2 compression, and/or the like), which may effectively reduce the number of and/or redistribute the logic involved with addition operations performed to generate a sum. Accordingly, in the illustrated embodiment, the three control signals (ctrl0, ctrl1, and ctrl2) may be added in memory (e.g., an arithmetic compressor 242) with less area (e.g., resources) than the adders 202 in the adder tree 220A of FIG. 6 may utilize to implement the +1 operations.

While the illustrated embodiment of the adder tree 220B shows the output of the arithmetic compressor 242 feeding into the third adder 202, the output of the arithmetic compressor 242 may add into any suitable location in the adder tree 220B. In some embodiments, such as the illustrated embodiment, the arithmetic compressor 242 may feed its output into an unbalanced tuple (e.g., third adder 202), because in such cases, the output of the arithmetic compressor 242 may be added into the adder tree 220B without utilizing an additional adder 202. Further, while arithmetic compressor 242 (e.g., ROM) is described as generating the correction factor, any suitable circuitry and/or compressor structure may be used. Additionally, the techniques described herein may be applied to any suitable size adder tree 220B and/or adder circuitry suitable for programmable inversion.

Figure 8:
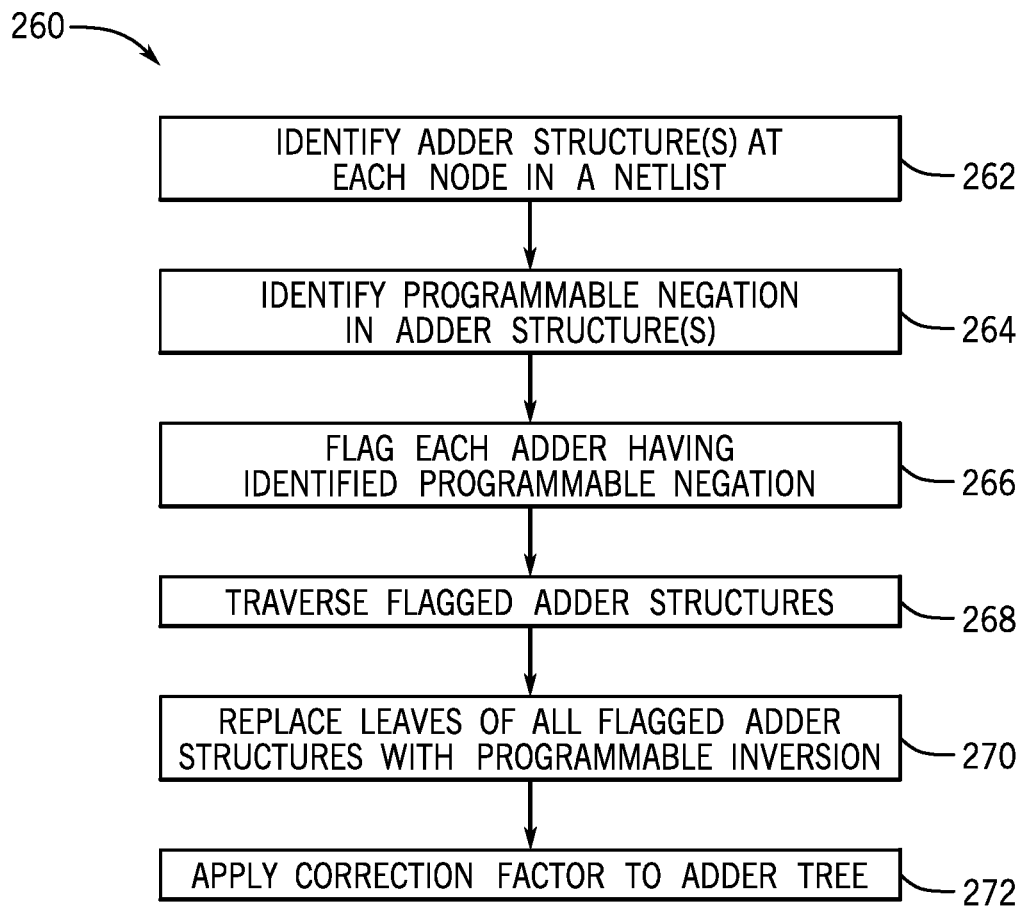
FIG. 8 is a method to synthesize a binary dot-product using programmable inversion circuitry in an integrated circuit, in accordance with an embodiment.

Turning now to FIG. 8, a method 260 provides a general depiction of the steps involved with synthesizing an integrated circuit device 12, such as an FPGA, and/or mapping logic included in the integrated circuit device 12 according to the techniques described herein. While the method 260 is described in the context of a particular embodiment, it should be noted that the steps included in the method 260 may be performed in any suitable order. Further, certain steps may be skipped altogether, and additional processes may be included in the method 260. Additionally, while the following is described as being performed by design software 14, each step may be performed by any suitable component or combination of components, which may be hosted by any suitable element or combination of elements within the system 10. Further, while the method 260 may include references to circuitry and/or physical components, it should be understood that in the context of the design software 14, this circuitry and/or these physical components may better be represented as high-level descriptions, or plans, for circuitry and/or physical components.

As discussed herein, a designer may implement a high-level design using the design software 14. These high-level designs may include and/or may generate a netlist, which may include descriptions of components and their connectivity for a circuit design. Accordingly, a netlist of a high-level design of a multiplier configured to implement a dot-product operation may include a description of circuitry to perform multiplication operations and of a tree of adders (e.g., an adder tree 220A or 220B) to sum the results of the multiplication operations. As such, this netlist may include a set of nodes, where components, such as the circuitry to perform the multiplication operations and the adders 202 included in the tree of adders, and/or their outputs may connect to one another. That is, for example, an adder 202 configured to receive a first input from a first component in the netlist and configured to receive a second input from a second component in the netlist may represent a node in the netlist where the first component and the second component connect.

In any case, after receiving a netlist for a circuit design, the design software 14 may identify adder structure(s) at each node in the netlist (process block 262). While topologies may vary between netlists, these adder structure(s) may include, for example, an adder tree 220A or 220B, a subtree (e.g., child) of an adder tree 220A or 220B, and/or the like. Accordingly, to identify such adder structure(s), the design software 14 may search for adders 202 as it traverses through the received netlist.

The design software 14 may then identify programmable negation implemented by adders within the identified adder structure(s) (process block 264). To do so, the design software 14 may identify a suitable connectivity (e.g., wiring) pattern used to implement the structure associated with programmable negation (e.g., (ctrl?A:−A)). That is, the design software 14 may identify selection circuitry 206 and/or a high-level design associated with the selection circuitry 206 coupled to the negation circuitry 201 and the number (A), as may be consistent with the programmable negation circuitry 200 illustrated in FIG. 5.

After identifying programmable negation in an adder 202, the design software 14 may flag (e.g., mark) the adder 202 (process block 266). To flag the adder 202, the design software 14 may maintain a list (e.g., an indexed list) of adders 202 and their location in the netlist, set a flag included in the netlist to true, and/or the like. In any case, the design software 14 may easily identify adders 202 that have already been recognized (e.g., flagged) as implementing programmable negation.

Further, after flagging the adder 202, the design software 14 may traverse through the adder structure having the flagged adder 202 (process block 268) to flag any adders 202 involved with the summation of flagged adders 202, to ensure the output of flagged adders 202 does not feed elsewhere, and to maintain full precision of adder outputs, whether flagged or not. Traversing the adder structure may involve hierarchically inspecting each of the adders 202 associated with the adder structure from the lowest level of a first flagged adder 202 (e.g., a leaf of the adder structure) to the highest level of the adder structure (e.g., the root of the adder structure).

Once the design software 14 has traversed from a leaf and/or the leaves of the adder structure to the head (e.g., root, or a final output adder 202) the design software 14 may replace the programmable negation associated with and/or implemented by each of the flagged adders 202 (e.g., flagged adder leaves) in the adder structure with circuitry suitable to perform programmable inversion, such as a ripple-carry adder (process block 270). That is, in some embodiments, each of the adders 202 used to implement the +1 operation involved with programmable negation may be removed and the adder structure may be restructured with a suitable number of ripple-carry adders that may be utilized to perform programmable inversion in place of each of the programmable negation operations. Accordingly, the restructured adder structure may include a reduced number of adders 202. Further, in some embodiments, the restructured adder structure may be connected to the ripple-carry adders in a manner suitable to generate a balanced adder tree 220B and/or an adder tree 220B with a minimal number of levels. In any case, the design software 14 may update the netlist to reflect changes used to implement the restructured adder structure.

As replacing programmable negation with programmable inversion may incur an error, as described herein, the design software 14 may then apply a correction factor (e.g., term) to the restructured adder structure (process block 272). Accordingly, to add the correction factor, the design software 14 may traverse through the adders 202 in the restructured adder structure to locate an input to an adder 202 that is not occupied (e.g., an unbalanced tuple). The design software 14 may then add the correction factor into the unbalanced tuple, which may allow the design software 14 to apply the correction factor without adding an additional adder 202 to the restructured adder structure. In some embodiments, such as the case where an unbalanced tuple is not located in the restructured adder structure, the design software 14 may insert the correction factor at the head of the restructured adder structure to add the correction factor with the output of the restructured adder structure. Such embodiments may utilize an additional adder after the head of the restructured adder structure. In any case, a read-only memory (ROM) may cheaply handle the summation of the control signals to generate a suitable correction factor. Accordingly, the design software 14 may associate an arithmetic compressor 242 and/or other suitable circuitry to generate the correction factor with a suitable portion of the restructured adder structure, as described above.

Further, while the method 260 may be described as converting and/or transforming an existing high-level design that includes an adder structure with programmable negation to one with programmable inversion and a correction factor, the method 260 and/or suitable steps involved with method 260 may be applied to more directly generate a high-level design with programmable inversion and a correction factor.

In some embodiments, for example, the design software 14 may include a library of functions the designer may choose from to construct a high-level design, and in some embodiments, the designer may construct the high-level design in the design software 14 using natural language expressions (e.g., mathematical notations) without having to select hardware implementations of the design. In either case, when the high-level design generated by the designer includes programmable negation, as represented with a library function and/or through natural language expressions, the design software 14 may implement the programmable negation using programmable inversion and a correction factor, as described herein. As such, the library function and/or the natural language expressions may map directly to programmable inversion and a correction, facilitating the design software 14 to generate this implementation of programmable negation (e.g., programmable inversion and a correction) without flagging and replacing existing implementations of programmable negation in, for example, the high-level design.

In some embodiments, the integrated circuit device 12 may use a ternary multiplication structure, which may include a ternary dot-product structure. In such embodiments, an input number (A) may be ternary-multiplied by a set of encoded weights (e.g., ternary weights). For example, with a first input number (A) and a second input number (B), the ternary-dot-product resulting from AB may be represented by $$AB=((A\hat{}W_{A2})\&!W_{A0})+((B\hat{}W_{B2})\&!W_{B0}),$$

where the encodings of weights with which each input is ternary-multiplied may be represented as $W_{X0}$='00', $W_{X1}$='01', and $W_{X2}$='10'. Accordingly, the possible outputs of AB generated by the ternary-dot-product included above may include 0, A, B, A+B, A−B, −A+B, and −A−B.

To implement these outputs, the integrated circuit device 12 may include a ternary-dot-product-LUT. In some embodiments, the ternary-dot-product LUT may receive two bits for each of the two weights (e.g., $W_{X0}$ and $W_{X2}$) and the two data inputs (e.g., A and B). Accordingly, the ternary-dot-product-LUT may contain six input bits to generate a suitable output of AB, as listed above. However, while some integrated circuit devices 12 may include a LUT (e.g., a ternary-dot-product-LUT) with six inputs, in some embodiments, six independent inputs may not be available for each LUT in a group of LUTs. For example, an integrated circuit device 12 may not include area and/or routing resources to accommodate six independent inputs for a group of eight, nine, and/or ten LUTs, which may be used for a ternary dot-product with eight-bit data inputs. As such, inputs may be shared across multiple LUTs. With the weights (e.g., $W_{X0}$ and $W_{X2}$) described above, a dot-product of nine elements (DOT9), for example, such as ABCDEFGHI, which may be implemented by a group of ternary-dot-product LUTs, may include up to two independent inputs and four shared inputs at each of the ternary-dot-product-LUTs. In some embodiments, the two independent inputs in a first logic layer (e.g., a first group of LUTs in a first layer) may respectively include A and B, C and D, E and F, G and H, and I, while the four shared bits may include the bits used to encode the two weights (e.g., $W_{X0}$ and $W_{X2}$).

While sharing two weights across a group of LUTs may reduce design complexity and/or improve routing in the integrated circuit device 12 compared to using six independent inputs, in some integrated circuit devices 12 and/or FPGA architectures, six inputs to each LUT used to implement a dot-product may be expensive to implement in terms of a number of logic layers and/or resources (e.g., hardware, area, wiring, and/or the like). Accordingly, in some embodiments, the input load to ternary-dot-product LUTs may be reduced so that two independent inputs and two shared inputs are received at each ternary-dot-product LUT.

Returning now to the DOTS example referenced above, the first tuple (e.g., AB) may be represented by one of the seven possible outputs (e.g., 0, A, B, A+B, A−B, −A+B, and −A−B) of the equation described above. In some embodiments, to capture a subset of these possible outputs, a ternary-dot-product LUT may only code the outputs A, B, A+B, and A−B, or four of the seven possible outputs. A fifth output, 0, may be handled with a common synchronous clear (SCLR) (e.g., synchronous reset) applied to each of the registers included in a carry chain used to implement a summation operation for the dot-product, and in some embodiments, this synchronous clear may be used without registering. The remaining outputs may be accounted for in a following logic layer of an adder tree 220A or 220B used to implement the dot-product, as described below.

The second logic layer of the adder tree 220A or 220B may then sum the first tuple (AB) with a second tuple (e.g., CD), which may be calculated in parallel to the calculation of the AB according to the techniques described above with reference to AB. Accordingly, the second logic layer may generate ABCD, which may represent AB+CD. However, since AB may be represented by a possible output that was not coded by the first logic layer (e.g., −A+B or −A−B), the second logic layer may also code the remaining two outputs (e.g., −A+B or −A−B) resulting from AB. To do so, the second logic layer may use programmable negation of the output of the first logic layer. In the case of −A+B, for example, the first logic layer may output A−B, and the second logic layer may negate this output (e.g., −(A−B)) to generate the desired output of −A+B. With −A−B, the first logic layer may output A+B, and the second logic layer may negate this output (e.g., −(A+B)) to generate the desired output of −A−B. Accordingly, the second logic layer may operate on a transformed (e.g., programmatically negated) output resulting from AB, which may be represented as AB'. To account for the remaining possible outputs not coded during the generation of CD, the second logic layer may additionally apply programmable negation to the output of CD resulting from the first logic layer to generate a transformed output, CD'.

In any case, to implement programmable negation in the second logic layer, LUTs included in the second logic layer may each receive two independent input bits (e.g, AB and CD) and two shared inputs along a carry chain, which may be used to sum tuples, such as AB and CD, of the second logic layer. Accordingly, additional LUTs in the second logic layer may receive the two shared inputs in addition to the independent inputs EF and GH to generate EFGH (e.g., EF+GH) according to the techniques described above with reference to AB and CD. Further, LUTs in the following logic layers (e.g., to generate ABCDEFGH and to generate ABCDEFGHI) may receive two independent inputs (e.g., ABCD and EFGH and ABCDEFGH and I, respectively) along with any control bits (e.g., shared inputs) used to negate I in the logic level in which it is added.

To further reduce the area and/or resources associated with implementing ternary dot-product computations, each of the programmable negation operations used to generate the transformed outputs (e.g., AB', CD', and/or the like), as described above, may be replaced with programmable inversion. Accordingly, a correction factor may be added to a suitable stage (e.g., logic layer) of the adder tree 220A or 220B and/or circuitry used to implement the dot-product. In the case of the DOTS example, the correction factor may be added with the lone output I to create a set of five tuples (e.g., AB, CD, EF, GH, and I and the correction factor) in the first logic layer, which may create a balanced sequence of additions in the remaining layers of the dot-product (e.g., the tree used to implement the dot-product).

Figure 9:
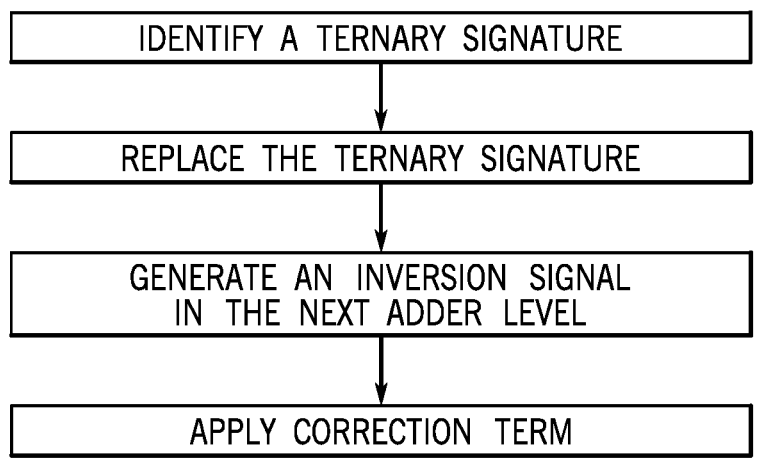
FIG. 9 is a method to synthesize a ternary dot-product using programmable inversion circuitry in an integrated circuit, in accordance with an embodiment.

Turning now to FIG. 9, a method 280 provides a general depiction of the steps involved with synthesizing an integrated circuit device 12, such as an FPGA, and/or mapping logic included in the integrated circuit device 12 to efficiently implement ternary multiplication structures, according to the techniques described herein. While the method 280 is described in the context of a particular embodiment, it should be noted that the steps included in the method 280 may be performed in any suitable order. Further, certain steps may be skipped altogether, and additional processes may be included in the method 280. Additionally, while the following is described as being performed by design software 14, each step may be performed by any suitable component or combination of components, which may be hosted by any suitable element or combination of elements within the system 10. Further, while the method 280 may include references to circuitry and/or physical components, it should be understood that in the context of the design software 14, this circuitry and/or these physical components may better be represented as high-level descriptions, or plans, for circuitry and/or physical components.

The method 280 may be initiated by any suitable event, such as the design software 14 receiving a netlist, the design software 14 determining the designer has created or is creating a new high-level design, and/or the like. In any case, after the method 280 is initiated, the design software 14 may identify a ternary signature (process block 282). The ternary signature may take the form: AB=((A^$W_{A2}$) &!$W_{A0}$)+((B^$W_{B2}$)&!$W_{B0}$), as discussed herein. Accordingly, the ternary signature may be identified by an inversion control and a zero control (e.g., ternary weights), each of which may be applied to the inputs (e.g., A and B). Further, the inversion control and the zero control may be applied to the length of a carry chain (e.g., to each input along the carry chain) included in a logic level of a ternary dot-product.

The design software 14 may then replace the identified ternary signature (process block 284) with a suitable function, such as AB=((A &!$W_{X1}$)+((B^$W_{X3}$)&! $W_{X0}$), where an example coding of the weights (e.g., control signals) may be represented by $W_{X0}$='00', $W_{X1}$='01', $W_{X2}$='10', and $W_{X3}$=11. While this function and coding of weights is provided as an illustrative example, any suitable combination of a function and a suitable coding of weights may be used. By replacing the ternary signature, the number of possible outputs resulting from AB may be reduced, as described herein. For example, instead of coding seven possible outputs for AB (e.g., 0, A, B, A+B, A−B, −A+B, −A−B) with the ternary signature, four possible outputs of AB (e.g., A, B, A+B, and A−B) may be encoded using the above function.

Accordingly, to account for the remainder of the possible outputs for AB (e.g., those not coded by the above function), the design software may then use programmable inversion (e.g., an inversion signal) instead of a programmable negation in the next logic level (process block 286). As such, −A+B and −A−B, for example, may be implemented by inverting the output of the first logic level and adding a correction factor into the adder tree 220A or 220B instead of by negating the output of the first logic level, as described in the example above.

Further, to suitably implement programmable inversion in place of programmable negation, a correction factor may be applied to the adder tree 220A or 220B and/or circuitry used to implement the dot-product. As discussed herein, this correction factor may reduce or substantially eliminate the error involved with implementing and/or replacing a negation operation with an inversion operation. The correction factor may be applied to the adder tree 220A or 220B in any suitable location, such as at an unbalanced tuple or at the head of the adder tree 220A or 220B. Further, the correction factor may be generated by an arithmetic compressor 242. Accordingly, the design software 14 may update a high-level design to include a suitable arithmetic compressor 242, such as a ROM, which, together with the techniques of programmable inversion described herein, may reduce the resources (e.g., wiring, area, hardware, and/or the like) involved with implementing a ternary dot-product.

Figure 10:
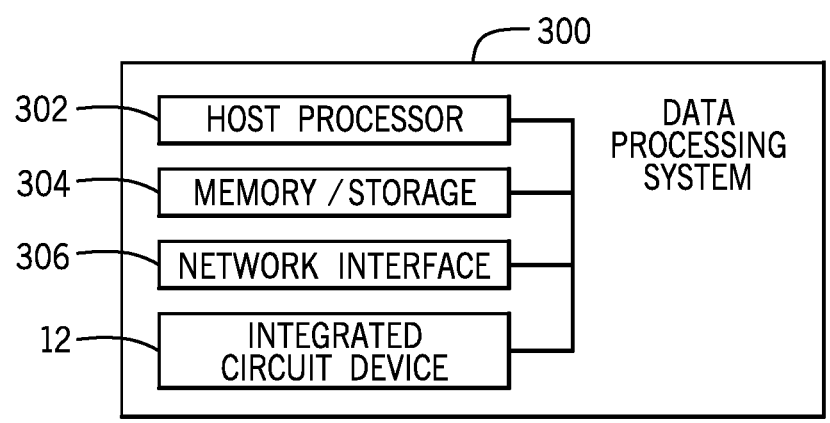
FIG. 10 is block diagram of a data processing system, in accordance with an embodiment.

The integrated circuit device 12 may be, or may be a component of, a data processing system. For example, the integrated circuit device 12 may be a component of a data processing system 300, shown in FIG. 10. The data processing system 300 may include a host processor 302, memory and/or storage circuitry 304, and a network interface 306. The data processing system 300 may include more or fewer components (e.g., electronic display, user interface structures, application specific integrated circuits (ASICs)). The host processor 302 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 300 (e.g., to perform machine learning, video processing, voice recognition, image recognition, data compression, database search ranking, bioinformatics, network security pattern identification, spatial navigation, or the like). The memory and/or storage circuitry 304 may include random access memory (RAM), read-only memory (ROM), one or more hard drives, flash memory, or the like. The memory and/or storage circuitry 304 may hold data to be processed by the data processing system 300. In some cases, the memory and/or storage circuitry 304 may also store configuration programs (bitstreams) for programming the integrated circuit device 12. The network interface 306 may allow the data processing system 300 to communicate with other electronic devices. The data processing system 300 may include several different packages or may be contained within a single package on a single package substrate.

In one example, the data processing system 300 may be part of a data center that processes a variety of different requests. For instance, the data processing system 300 may receive a data processing request via the network interface 306 to perform machine learning, video processing, voice recognition, image recognition, data compression, database search ranking, bioinformatics, network security pattern identification, spatial navigation, or some other specialized task. The host processor 302 may cause the programmable logic fabric of the integrated circuit device 12 to be programmed with a DNN topology 100 suitable to implement a requested task. For instance, the host processor 302 may instruct that a configuration data (bitstream) stored on the memory and/or storage circuitry 304 to be programmed into the programmable logic fabric of the integrated circuit device 12. The configuration data (bitstream) may represent a circuit design for a DNN topology 100, which may be mapped to the programmable logic according to the techniques related to low-precision computations and dot-products described herein, to efficiently perform and/or compute the requested task. By efficiently mapping the DNN topology 100 to the programmable logic, which may reduce routing and area resources used to perform the requested task, the integrated circuit device 12 may rapidly assist the data processing system 300 in performing the requested task.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit device, comprising:
    first input circuitry configured to receive a first input;
    second input circuitry configured to receive a first control signal;
    third input circuitry configured to receive a second input;
    fourth input circuitry configured to receive a second control signal;
    first combinatorial circuitry coupled to the first input circuitry and the second input circuitry, wherein the first combinatorial circuitry is configured to receive the first input from the first input circuitry and the first control signal from the second input circuitry, and wherein the first combinatorial circuitry comprises first output circuitry and is configured to generate a first output at the first output circuitry by selectively inverting the first input based at least in part on the first control signal;
    second combinatorial circuitry coupled to the third input circuitry and the fourth input circuitry, wherein the second combinatorial circuitry is configured to receive the second input from the third input circuitry and the second control signal from the fourth input circuitry, and wherein the second combinatorial circuitry comprises second output circuitry and is configured to generate a second output at the second output circuitry by selectively inverting the second input based at least in part on the second control signal;
    arithmetic compression circuitry coupled to the second input circuitry and the fourth input circuitry and configured to generate a correction factor based at least in part on a compressed sum of the first control signal and the second control signal, wherein the arithmetic compression circuitry is configured to receive the first control signal from the second input circuitry and the second control signal from the fourth input circuitry; and
    adder circuitry coupled to the first output circuitry, the second output circuitry, and the arithmetic compression circuitry and configured to generate a sum of the first output, the second output, and the correction factor, wherein the adder circuitry is configured to receive the first output from the first output circuitry, the second output from the second output circuitry, and the correction factor from the arithmetic compression circuitry.

2. The integrated circuit device of claim 1, wherein the sum is equivalent in value to an additional sum of the first input selectively negated based at least in part on the first control signal and the second input selectively negated based at least in part on the second control signal.

3. The integrated circuit device of claim 1, wherein the first combinatorial circuitry comprises a look up table.

4. The integrated circuit device of claim 1, wherein the first combinatorial circuitry is configured to selectively invert the first input based at least in part on an exclusive OR of the first input and the first control signal.

5. The integrated circuit device of claim 1, wherein the arithmetic compression circuitry comprises read-only memory.

6. The integrated circuit of claim 1, wherein the integrated circuit comprises a field-programmable gate array.

7. The integrated circuit device of claim 1, wherein the sum comprises a dot-product.

8. The integrated circuit device of claim 1, comprising shift circuitry configured to right-shift the sum a number of bits based at least in part on a bit-width of the sum and a configured bit-width, wherein the configured bit-width is stored on the integrated circuit.

9. The integrated circuit device of claim 8, wherein the integrated circuit is configured to implement a deep neural network, wherein the configured bit-width is generated based at least in part on a maximum number of values generated by a first layer in the deep neural network and a minimum number of values generated by a second layer in the deep neural network.

10. The integrated circuit of claim 9, wherein the configured bit-width is based at least in part on a maximum value generated in a subset of one or more values generated in the deep neural network, wherein a number of values included in the subset is based at least in part on the minimum number of values.

11. The integrated circuit of claim 1, wherein the integrated circuit is configured to implement a deep neural network, wherein the first input comprises a subset of one or more bits in an 8-bit activation of the deep neural network.

12. A tangible, non-transitory, machine-readable medium, comprising machine-readable instructions that, when executed by one or more processors, cause the processors to:
receive design instructions to configure programmable logic on an integrated circuit;
identify, in the design instructions, an adder structure, wherein one or more adders in the adder structure are configured to perform programmable negation on one or more respective inputs;
flag the one or more adders configured to perform programmable negation;
replace, in the design instructions, the flagged one or more adders with programmable inversion circuitry, wherein the programmable inversion circuitry comprises:
combinatorial circuitry configured to selectively invert each of the one or more inputs based at least in part on a respective one or more control signals; and
arithmetic compression circuitry configured to generate a correction factor based at least in part on the one or more control signals; and
route, in the design instructions, the correction factor to an unbalanced tuple in the adder structure or add an additional adder to the adder structure and route the correction factor to the additional adder.

13. The tangible, non-transitory, machine-readable medium of claim 12, wherein the machine-readable instructions, when executed by one or more processors, cause the processors to configure the programmable logic according to the design instructions after routing the correction factor to the unbalanced tuple or to the additional adder.

14. The tangible, non-transitory, machine-readable medium of claim 12, wherein the machine-readable instructions, when executed by one or more processors, cause the processors to:
in response to receiving instructions from a designer, generate the design instructions.

15. The tangible, non-transitory, machine-readable medium of claim 14, wherein the instructions comprise directions to perform programmable negation on an additional one or more inputs, wherein generating the design instructions comprises generating an additional adder structure, wherein the additional adder structure comprises the programmable inversion circuitry configured to perform the programmable negation on the additional one or more inputs.

16. A tangible, non-transitory, machine-readable medium, comprising machine-readable instructions that, when executed by one or more processors, cause the processors to:
receive design instructions to configure programmable logic on an integrated circuit to compute a ternary dot-product;
identify, in the design instructions, a first ternary signature in an adder structure configured to compute the ternary dot-product, wherein the first ternary signature is configured to produce a set of products of a first input ternary-multiplied by a first set of weights and a second input ternary multiplied by a second set of weights;
replace, in the design instructions, the first ternary signature with a second ternary signature, wherein the second ternary signature is configured to produce a first subset of the set of products;
configure, in the design instructions, programmable inversion circuitry to selectively generate a second subset of the set of products based at least in part on programmable inversion of a portion of the first subset, wherein the programmable inversion circuitry comprises:
combinatorial circuitry configured to selectively invert each of the one or more products in the first subset based at least in part on a respective one or more control signals; and
arithmetic compression circuitry configured to generate a correction factor based at least in part on the one or more control signals; and
route, in the design instructions, the correction factor to an unbalanced tuple in the adder structure or add an adder to the adder structure and route the correction factor to the adder.

17. The tangible, non-transitory, machine-readable medium, of claim 16, wherein the machine-readable instructions, when executed by one or more processors, cause the processors to configure the programmable inversion circuitry in a logic level of the adder structure following an additional logic level of the adder structure, wherein the second ternary signature is implemented in the additional logic level.

18. The tangible, non-transitory, machine-readable medium, of claim 16, wherein each of the one or more products in the second subset are equivalent in value to a respective negate of the one or more products in the portion of the first subset.

19. The tangible, non-transitory, machine-readable medium, of claim 16, wherein the machine-readable instructions, when executed by one or more processors, cause the processors to, based at least in part on the design instructions, configure the programmable logic on the integrated circuit after routing, in the design instructions, the correction factor to the unbalanced tuple or to the adder.

20. The tangible, non-transitory, machine-readable medium, of claim 16, wherein the first set of weights comprises a set of one or more two-bit weights.

* * * * *